April 13, 1954 L. E. BARTON 2,675,509

HIGH-FREQUENCY RESPONSE SEMICONDUCTOR DEVICE

Filed July 26, 1949

Inventor
LOY E. BARTON

By H. C. Newton
Attorney

Patented Apr. 13, 1954

2,675,509

UNITED STATES PATENT OFFICE 2,675,509

HIGH-FREQUENCY RESPONSE SEMI-CONDUCTOR DEVICE

Loy E. Barton, Princeton, N. J., assignor to Radio Corporation of America, a corporation of Delaware Application July 26, 1949, Serial No. 106,926

1 Claim. (Cl. 317—235)

Figure 1:
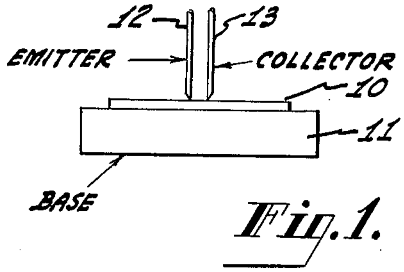

This invention relates generally to semi-conductor devices and particularly to a three-electrode semi-conductor amplifier or oscillator having improved high frequency performance and a large heat dissipation.

The three-electrode semi-conductor has recently been developed as an amplifier or oscillator. This device, which has been termed a "transistor," has been disclosed in a series of three letters to the Physical Review by Bardeen and Brattain, Brattain and Bardeen, and Shockley and Pearson which appear on pages 230 to 233 of the July 15, 1948, issue. The new amplifier includes a block of a semi-conducting material such as silicon or germanium which is provided with two closely adjacent point electrodes called "emitter" and "collector" electrodes in contact with one surface region of the material, and a "base" electrode which provides a large-area, low-resistance contact with another surface region of the semi-conducting material. This amplifier provides voltage as well as current gain under proper operating conditions and may be considered as a three-terminal network having a common input and output terminal. Thus, the device is effectively a four-terminal network having a common input and output electrode which may, for example, be the base electrode.

It is well known that a conventional transistor has an upper frequency limit in the neighborhood of 10 mc. (megacycles). Thus, when the device is used as an amplifier its amplification drops for signal frequencies in the megacycle region. This is believed to be due at least in part to the transit time of the carriers of electric charges. In an N type semi-conductor which may, for example, consist of germanium and which is assumed to have a P type surface layer, the charge carriers consist of holes. On the other hand, if the semi-conductor is of the P type which is assumed to have an N type surface layer, the charge carriers are electrons. The transit time of the charge carriers is a function of the spacing and of the voltage between the emitter and collector electrodes and is also believed to depend on the thickness of the crystal. Due to the difference of the paths of the charge carriers flowing between the emitter and collector electrodes, there will also be a certain transit time spread.

It has been found experimentally that the transit time spread causes a reduction of the magnitude of the output signal and is accompanied by an increase of the resistance loading of the input circuit. Thus, the resistance of a three-electrode semi-conductor looking into the base electrode under normal operating conditions is negative at low frequencies. However, at high frequencies the resistance looking into the base electrode becomes positive and may become quite low. This decrease of the input resistance is a result of a phase shift between the input and output currents or voltages. Thus, it seems reasonable to assume that if the transit time and particularly the transit time spread of the charge carriers is reduced, the frequency response of the device may be improved.

When current flows through a three-electrode semi-conductor the semi-conducting material or crystal becomes heated. It has also been found experimentally that the operation of the device is impaired when the temperature of the crystal rises substantially above room temperature. This may be explained by the fact that a semi-conducting crystal has a higher conductivity at higher temperatures due to the presence of a larger number of free electrons. It is therefore desirable to provide a semi-conductor amplifier or oscillator having a large heat dissipation thereby to maintain the crystal substantially at room temperature.

It is accordingly the principal object of the present invention to provide an improved semi-conductor device suitable as an amplifier or oscillator which will operate satisfactorily at higher frequencies than conventional devices.

A further object of the invention is to provide a three-electrode semi-conductor device having a large heat dissipation thereby substantially to prevent the semi-conducting crystal from becoming unduly heated and to improve the operation of the device.

Another object of the invention is to provide a semi-conducting device of the character described having a resistance looking into the base electrode which remains negative at higher operating frequencies than in prior art devices.

A semi-conductor device in accordance with the present invention comprises a semi-conducting crystal having a thickness no greater than 5 mils in the vicinity of the rectifying electrodes, that is, of the emitter and collector electrodes. The crystal preferably consists of germanium and may have two plane, substantially parallel surfaces. The rectifying electrodes, that is, the emitter and collector electrodes may consist of pointed wires which are preferably spaced apart one mil or less thereby to reduce the transit time of the charge carriers.

By reducing the thickness of the crystal to less than 5 mils the difference between the arrival times of the charge carriers emitted by the emitter electrode and collected by the collector electrode is reduced to a minimum. It has been found that the thus resulting device has a better performance at higher frequencies than previously known semi-conductor devices.

Figure 2:
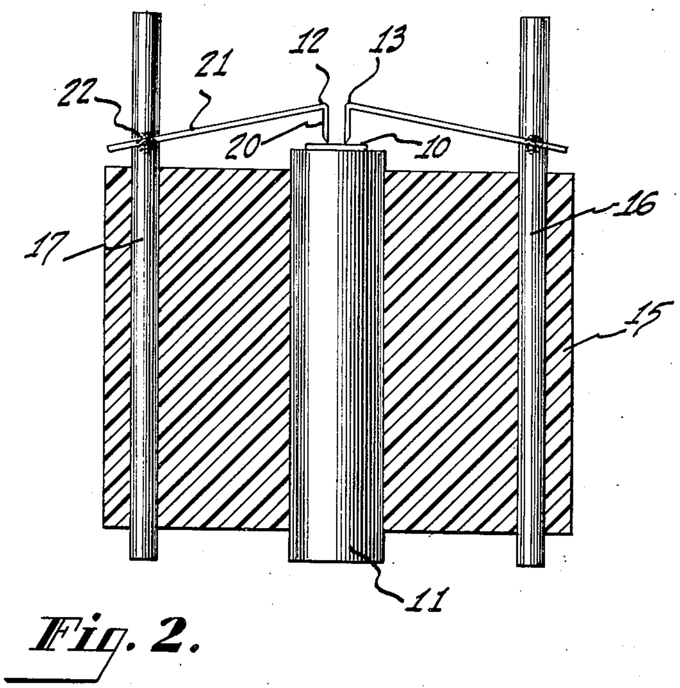

The novel features that are considered characteristic of this invention are set forth with particularity in the appended claims. The invention itself, however, both as to its organization and method of operation, as well as additional objects and advantages thereof, will best be understood from the following description when read in connection with the accompanying drawing, in which:

Figure 1 is an elevational view of a three-electrode semi-conductor device embodying the present invention; and Figure 2 is a sectional view of a semi-conductor device in accordance with the invention and illustrating particularly the construction of its electrodes.

Referring now to the drawing in which like components have been designated by the same reference numerals throughout the figures, and particularly to Figure 1, there is illustrated a semi-conductor device embodying the present invention which may be used as an amplifier, oscillator or the like. The device comprises a block 10 of semi-conducting material consisting, for example, essentially of a chemical element having semi-conducting properties such as germanium, silicon, boron, tellurium, or selenium containing a small but sufficient number of atomic impurity centers or lattice imperfections as commonly employed for best results in crystal rectifiers. Germanium is the preferred material for block 10 and may be prepared so as to be an electronic N type semi-conductor crystal as is well known. The top surface of semi-conducting block 10 may be polished and etched in the manner explained in the paper by Bardeen and Brattain referred to. It is also feasible to utilize the germanium block from a commercial high-back voltage germanium rectifier such as the type 1N34.

Block 10 preferably has a plane top and bottom surface which are parallel to each other. In accordance with the present invention the thickness of crystal 10 preferably does not exceed 5 mils (one mil being 1/1000 inch) and the crystal may be as thin as one mil. The crystal may be prepared by grinding a thicker crystal to the desired size of 5 mils or less. After the crystal is ground it may be polished and thereafter it is etched in the conventional manner. It is also feasible to evaporate a crystalline layer onto a suitable metallic support. However, it is essential that the evaporated layer of germanium be of crystalline structure. The top surface of crystal 10 may, for example, be square or rectangular.

Crystal 10 is secured to metallic support 11 which serves as a base electrode having a relatively low contact resistance with crystal 10. Accordingly, support 11 functions as a non-rectifying electrode. Base electrode 11 may be provided by soldering or sweating a metallic member which may consist of brass, to block 10. Base electrode 11 preferably has a comparatively large mass and consists of a metal which is a good conductor of heat. This serves the purpose of maintaining crystal 10 cool, that is, substantially at room temperature during its operation as an amplifier or oscillator. As explained hereinabove this will improve the operation of the device.

The device of Figure 1 is further provided with emitter electrode 12 and collector electrode 13 which form high-resistance or rectifying electrodes. As illustrated in Figure 1, electrodes 12 and 13 may consist of pointed wires in the form of the well known cat-whiskers. The distance between electrodes 12 and 13 should be less than 2 mils and preferably is between one mil and .5 mil.

When the device of Figure 1 is used as an amplifier its power gain amounts to approximately 22 db (decibels). The frequency response of the device is very good and a twofold increase of the highest frequency at which the device may be operated has been observed. The resistance looking into base electrode 11 is still negative at an operating frequency of more than 1.5 mc. It has been found that when the device is connected as a conventional Hartley oscillator its maximum frequency of oscillation is 8.5 mc. No phase shift network was provided between the input and output circuits of the oscillator. A conventional semi-conductor device having a crystal thickness of 30 to 40 mils and connected as a Hartley oscillator had a maximum oscillatory frequency in the neighborhood of 2 mc.

It is believed that the improvement in performance of the device of Figure 1 is due partly to the reduced transit time which is obtained in view of the closer spacing between electrodes 12 and 13. Furthermore, the reduced thickness of crystal 10 prevents a large transit time spread because the difference in the paths of the charge carriers flowing from emitter electrode 12 to collector electrode 13 through crystal 10 is greatly reduced. However, at the present time it is not possible to give a more detailed theory of the effects of transit time spread of the charge carriers.

Figure 2 illustrates a practical form of construction of the semi-conductor device of the invention. Crystal 10 is secured to stud 11 which may consist of brass and which functions as the base electrode. Stud 11 has a press fit with and extends through insulating support 15. Stud 11 may have a diameter of $\frac{1}{16}''$, for example. Two heavy wires 16 and 17 also extend through support 15 and are fixed thereto. Wires 16 and 17 may, for example, have a diameter of 20 mils. Emitter electrode 12 and collector electrode 13 may consist of Phosphor bronze wires. Wires 12 and 13 may have chisel points as illustrated. Each wire 12, 13 may have a substantially vertical portion of a length of approximately $\frac{1}{32}''$. Each wire 12, 13 further has a straight portion 21 which is soldered to the respective supports 16, 17 as shown at 22. Wire portions 20 and 21 form an acute angle, and preferably the solder connections 22 are located substantially in the plane passing through the top surface of crystal 10.

In order to obtain the required contact pressure, stud 11 is pushed upward against wires 12 and 13. Each wire will now bend adjacent its welding connection 22 while the two vertical wire portions 20 will move parallel to each other so that the distance between the contact points of the electrodes remains constant. Stud 11 provides for a large heat dissipation, thereby to keep crystal 10 substantially at room temperature.

There has thus been disclosed a three-electrode semi-conductor device having a large heat dissipation and a better high frequency performance. The input resistance looking into the base electrode remains negative even at frequencies above 1.5 mc.

What is claimed is:

A high frequency transistor comprising a semiconducting body having two plane surfaces substantially parallel to each other, two rectifying point electrodes in contact with one of said surfaces, said point electrodes being spaced approximately one mil apart, and a large area electrode in low resistance contact with the other of said surfaces, the thickness of said body between said surfaces being between approximately 5 mils and approximately 1 mil, thereby to provide a device having a large heat dissipation and a high frequency response.

References Cited in the file of this patent

UNITED STATES PATENTS

| Number | Name | Date |
|---|---|---|
| 2,441,590 | Ohl | May 18, 1948 |

| Number | Name | Date |
|---|---|---|
| 2,486,776 | Barney | Nov. 1, 1949 |
| 2,502,479 | Pearson | Apr. 4, 1950 |
| 2,524,034 | Brattain et al. | Oct. 3, 1950 |
| 2,524,035 | Bardeen et al. | Oct. 3, 1950 |
| 2,560,579 | Kock et al. | July 17, 1951 |
| 2,560,594 | Pearson | July 17, 1951 |
| 2,577,803 | Pfann | Dec. 11, 1951 |
| 2,646,609 | Heins | July 28, 1953 |

OTHER REFERENCES

White: Audio Engineering, August 1948, pp. 28, 29, 39.